United States Patent [19]

Houser, Jr. et al.

[11] Patent Number: 5,051,613
[45] Date of Patent: Sep. 24, 1991

[54] LOW VOLTAGE DC ONE-SHOT CIRCUIT

[75] Inventors: John M. Houser, Jr., Stow; Oliver G. Loughner, Cleveland, both of Ohio

[73] Assignee: Lucerne Products, Inc., Hudson, Ohio

[21] Appl. No.: 533,100

[22] Filed: Jun. 4, 1990

[51] Int. Cl.$^5$ .................. H03K 3/02; H03K 3/355; H03K 17/687; H03K 3/033
[52] U.S. Cl. .................. 307/296.3; 307/584; 307/273; 307/304; 307/593
[58] Field of Search .............. 307/296.3, 582, 583, 307/584, 585, 273, 270, 304; 340/636; 363/61

[56] References Cited

U.S. PATENT DOCUMENTS

| | | | |
|---|---|---|---|
| 3,946,253 | 3/1976 | Solberg | 307/296.3 X |
| 4,691,382 | 9/1987 | Nakajima | 307/296.3 X |
| 4,965,465 | 10/1990 | Denda | 307/273 |
| 5,010,260 | 4/1991 | Norwood et al. | 307/296.3 X |

Primary Examiner—Stanley D. Miller
Assistant Examiner—David R. Bertelson
Attorney, Agent, or Firm—Renner, Kenner, Greive, Bobak, Taylor & Weber

[57] ABSTRACT

A low voltage DC one-shot circuit momentarily increases the voltage applied by a NiCad battery pack to the gate of a MOSFET. A charge pump generates a supply voltage to a monostable multivibrator which is manually actuated by a switch to emit an output pulse of fixed amplitude and pulse width. The pulse is passed through a level shift network where it is summed with a bias voltage for application to the gate of the MOSFET.

15 Claims, 1 Drawing Sheet

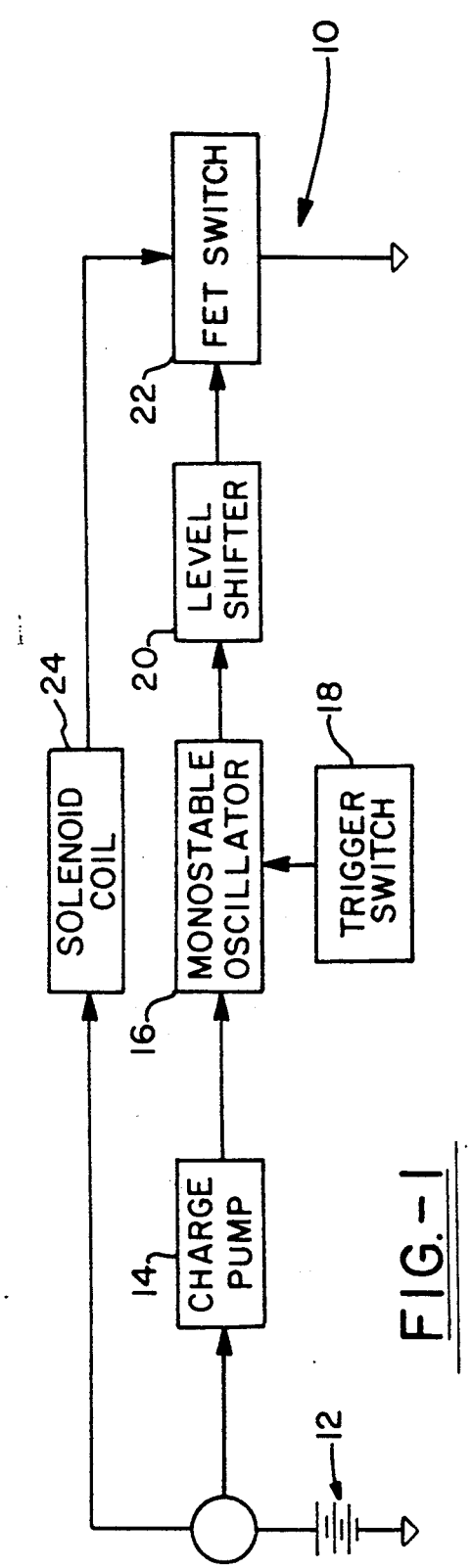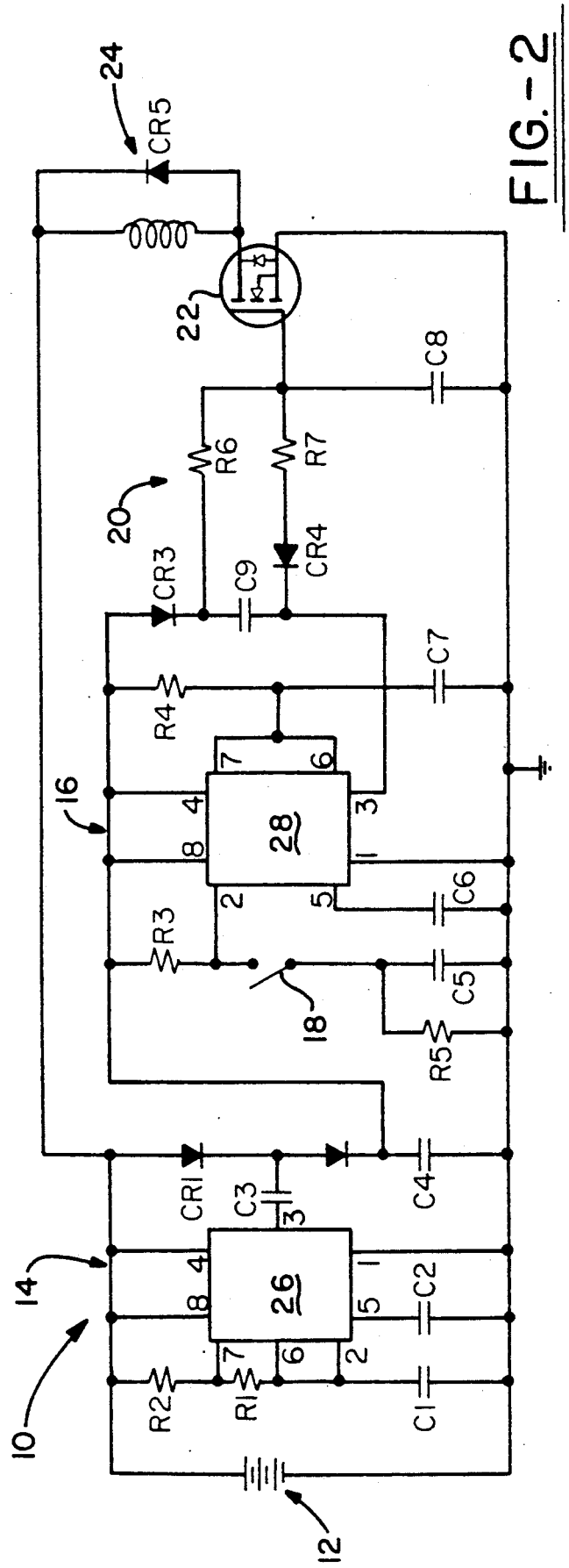

LOW VOLTAGE DC ONE-SHOT CIRCUIT

TECHNICAL FIELD

The invention herein resides in the art of electronic control devices and, more particularly, to a low voltage, low power, triggering circuit for actuating a load.

BACKGROUND ART

Hand tools today are typically powered by rechargeable batteries. Most common among these batteries are the nickel cadmium batteries which are low voltage and high energy power sources attractive for use in such devices. However, such batteries are quite expensive and, accordingly, it is most desirable that the number of such batteries used in any particular device be kept at a minimum.

In certain applications such as electric staple guns and the like, there is a need for the provision of high levels of power for short durations of time. In the example of a staple gun, when the operative solenoid is activated by a MOSFET, there is a substantial need for a high level of actuating power through the solenoid and MOSFET for a very short duration of time. While a simple series interconnection of a plurality of NiCad batteries could provide the requisite power level, in the example just given as many as seven NiCad batteries could be required to provide the requisite power surge on demand. The cost of the NiCad batteries would, in such an instance, be prohibitive.

While it is a rather simple proposition to increase voltage from an AC power source, it is a more difficult proposition in systems employing DC power sources. Specifically, while it is quite simple to employ transformers or the like to step-up a voltage level on an AC basis, it is a more difficult proposition to obtain such an increase when the system employs a DC power source. Indeed, when the power source is necessarily DC, as in hand tools, the cost of converting the DC source to an AC signal for employment of transformers and the like substantially depletes the savings enjoyed by the reduction in the number of NiCad batteries required for simple series interconnection.

It is further desired that the actuation of the hand tool be undertaken by a positive overt command, not given to misfiring, double firing, or the like. In hand tools such as staple guns, rivet guns, nailers, and the like, such safety features are most desirable.

DISCLOSURE OF INVENTION

In light of the foregoing, it is a first aspect of the invention to provide a low voltage DC one-shot circuit which uses a low voltage NiCad battery source to drive a MOSFET.

Another aspect of the invention is to provide a low voltage DC one-shot circuit which provides high power for a short duration burst from a low voltage, high energy source.

Another aspect of the invention is the provision of a low voltage DC one-shot circuit which prevents false or double triggering of the hand tool in which it is employed.

Yet an additional aspect of the invention is the provision of a low voltage DC one-shot circuit which is rapid in operation and reliable and repeatable in use.

The forgoing and other aspects of the invention which will become apparent as the detailed description proceeds are achieved by a low voltage DC one-shot circuit for applying power to a load, comprising: a DC voltage source presenting a voltage of a first level; a charge pump connected to said DC voltage source and generating a DC output voltage of a second level, said second level being greater than said first level; a pulse generator connected to said charge pump and powered by said DC output voltage; a power gate control device connected to the load; and biasing means interconnected between said pulse generator and said power gate control device, biasing an input to said power gate control device to a predetermined level, said pulse generator presenting an output signal to said power gate control device through said biasing means.

Other aspects of the invention which will become apparent herein are obtained by a DC one-shot power supply, comprising: a battery power source; a charge pump connected to said battery power source and presenting an output of fixed frequency and amplitude; a first capacitor interconnected between said battery power source and said charge pump and generating a supply voltage; a pulse generator connected to and powered by said supply voltage; switch means connected to said pulse generator for activating said pulse generator to emit an output pulse of fixed amplitude and time duration; a power gate control device; and biasing means for adding a fixed voltage value to said output pulse and applying said output pulse to said power gate control device.

DESCRIPTION OF DRAWINGS

For a complete understanding of the objects, techniques and structure of the invention reference should be made to the following detailed description and accompanying drawings wherein:

FIG. 1 is a block diagram of a low voltage DC one-shot circuit according to the invention; and FIG. 2 is a detailed circuit schematic of the low voltage DC one-shot circuit of the invention.

BEST MODE FOR CARRYING OUT THE INVENTION

Referring now to the drawings and more particularly FIG. 1, it can be seen that a low voltage DC one-shot circuit is designated generally by the numeral 10. Power is provided by a battery pack 12 which, in a preferred embodiment, comprises three nickel cadmium (NiCad) batteries in series interconnection such that the total voltage output is three times that of a single battery. In the preferred embodiment, the battery pack 12 provides a voltage supply of 3.6 volts.

Battery pack 12 provides power to a charge pump or voltage doubler 14. The charge pump 14 serves as a supply voltage to the monostable multivibrator or one-shot 16. It will be appreciated that the output of the charge pump 14 is substantially twice the output of the battery pack 12, but is slightly less than that value due to losses and the like. In the preferred embodiment, the output of the charge pump 14 which is supplied to the one-shot 16 is on the order of 6 volts. Accordingly, the one-shot 16 sends an output signal of preset time duration and having an amplitude of approximately 6 volts. The pulse amplitude is set by the output of the charge pump 14. Actuation of the one-shot 16 is obtained through the trigger switch 18 which is part and parcel of the hand tool employing the circuit 10 and which is manually actuated.

The output of the one-shot 16 is passed through the level shifter 20 which provides a voltage bias. Accordingly, the output of the level shifter 20 is the pulse output the one-shot 16, increased in amplitude by the bias set by the level shifter 20. The purpose of the bias voltage is to provide the pulse signal with sufficient amplitude to activate the field effect transistor (FET) switch 22 which, in the preferred embodiment, constitutes a MOSFET gate. Actuation of the FET switch 22 energizes the solenoid coil 24 which is an integral part of the dispensing system of the associated hand tool. In the instance of a stapler, the solenoid coil 24 actuates the appropriate plunger for dispensing a staple. The same is similarly true for an automatic nailer or the like.

With reference now to FIG. 2, an appreciation of the detailed circuitry of the invention can be obtained. As shown, the battery pack 12 of the low voltage DC one-shot circuit 10 is connected to the charge pump 14 which comprises, in principal part, a CMOS 555 timer 26. The timer 26 oscillates in a free-running mode at approximately 166 KHz, with a duty cycle of approximately fifty percent. The frequency and duty cycle are determined by the timing components consisting of resistors R1 and R2, and capacitor C1. The output of the timer or oscillator 26 is passed to the capacitor C3.

When the output of the oscillator 26 is low, diode CR1 is forward biased, charging capacitor C3 to the voltage level of the battery pack 12. At the same time, diode CR2 is forward biased until the voltage on capacitor C4 equals the voltage on capacitor C3. When the output of oscillator 26 toggles to a high level, diode CR2 again becomes forward biased as the voltage of capacitor C3 is added to the voltage of the battery pack 12, dumping the sum of the output of the oscillator 26 and the voltage of the capacitor C3 onto the capacitor C4. Accordingly, diode CR1 becomes reverse biased at this time, preventing undesired dissipation of this energy through the remainder of the circuit. Thus, capacitor C4 is effectively charged to a level double that of the battery pack 12, reduced slightly by the diode drops of CR1 and CR2, as well as the circuit loading. The voltage of capacitor C4 functions as the supply voltage to the one-shot 16 and level shift network 20, to be discussed below.

As shown, the monostable multivibrator or one-shot 16 is comprised principally of a CMOS 55 timer connected as a one-shot timed-output oscillator in which the pulse duration is established by the values of resistor R4 and capacitor C7. The actuating input of the one-shot oscillator 28 is selectively interconnected between the supply voltage of the capacitor C4 and ground by means of the switch 18 and RC network resistors R3, R5 and capacitor C5. It will be appreciated that resistor R5 is a bleeder for capacitor C5 when the switch 18 is open. When the switch 18 is open, resistor R3 holds the input of the one-shot 28 at the supply voltage level of capacitor C4. The junction of the capacitor C5 and resistor R5 is at ground potential. Accordingly, when the switch 18 is closed, the input of the one-shot 28 is switched to ground, producing an output-pulse to the level shift network 20. The voltage level of the pulse is substantially equal to the supply voltage of capacitor C4, with the time duration being established by the resistor R4 and capacitor C7. When switch 18 is opened, the capacitor C5 discharges through the resistor R5 and the input to the one-shot 28 is again at a high level, preventing any faulty output. With the one-shot 28 being triggered by the falling edge of a voltage signal, it can only be triggered on closure of the switch 18 which serves to ground the input thereof.

In the preferred embodiment of the invention, the output of the one-shot 28 is a pulse of fixed time duration passing from an off level of zero volts to an on level of 6 volts DC. However, saturation requirements of the FET switch 22 demand a gate drive voltage of at least 7 volts DC before turn-on. In order to meet this requirement, the level shifting circuit consisting of capacitor C9 and diodes CR3 and CR4 in conjunction with resistors R6 and R7 is used. When the output of the one-shot 28 is low, diode CR3 charges capacitor C9 to the supply voltage level of capacitor C4, approximately 6 volts. Voltage at the junction of the voltage divider of resistors R6, R7, due to the relative values of those resistors, is approximately 2 volts. When the output of the one-shot 28 is pulsed high (6 volts), the diode CR3 is reverse biased such that the voltage at the gate of the FET 22 is the sum of the 2 volt bias plus the 6 volt transition of the pulse. It will, of course, be appreciated that resistors R6, R7 and diode CR4 also serve as a discharge path for capacitor C9.

As just presented the output pulse from the one-shot 28 is coupled by the capacitor C9, to the gate of the FET 22 and is level shifted from a 6 volt level to an 8 volt level, such being one volt greater than necessary to saturate the gate of the FET 22. In other words, capacitor C9 and voltage divider R6, R7 provide a two volt bias at the gate of the FET 22 such that the coupled output from the one-shot 28, though only 6 volts in amplitude, translates to an 8 volt pulse due to the bias of the level shift network 20.

The scaled output of the one-shot 16, coupled through the capacitor C9, activates the FET 22, whose source is tied to ground and whose drain is connected to the solenoid coil 24 of the stapler, nailer or the like. The other end of the load or coil 24 is connected to the battery pack 12. Accordingly, coil 24 is actuated for a period of time equal to the pulse width of the output of the one-shot 28, the same being sufficient to energize and activate the associated stapler, nailer, or other implement.

It should be appreciated by those skilled in the art that the two volt level which is continually present on the gate of the FET 22 is not sufficient to cause problems with battery discharge during the off state. It will also be appreciated that the free-wheeling diode CR5 suppresses switching transients caused by the solenoid coil 24 when the FET 22 turns on. Further, capacitor C8 is provided at the gate of the FET 22 to slow down turn-off of the FET 22 and the dissipation of energy until the diode CR5 can respond.

Thus it can be seen that the objects of the invention have been satisfied by the structure and technique presented above. The low voltage DC one-shot circuit of the invention is readily adapted for allowing a low voltage, but high energy source to cost effectively operate a MOSFET to control the firing of a solenoid or similar device in a hand tool. While in accordance with the patent statutes only the best mode and preferred embodiment of the invention has been presented and described in detail, it will be understood that the invention is not limited thereto or thereby. Accordingly, for an appreciation of the true scope and breadth of the invention reference should be made to the following claims.

What is claimed is:

1. A low voltage DC one-shot circuit for applying power to a load, comprising:
   a DC voltage source presenting a voltage of a first level;
   a charge pump connected to said DC voltage source and generating a DC output voltage of a second level, said second level being greater than said first level;
   a pulse generator connected to said charge pump and powered by said DC output voltage;
   a power gate control device connected to the load; and
   biasing means interconnected between said pulse generator and said power gate control device, biasing an input to said power gate control device to a predetermined level, said pulse generator presenting an output signal to said power gate control device through said biasing means.

2. The low voltage DC one-shot circuit as recited in claim 1, wherein said charge pump comprises an oscillator charging a first capacitor.

3. The low voltage DC one-shot circuit as recited in claim 2, wherein said first capacitor is also connected to and charged by said DC voltage source.

4. The low voltage DC one-shot circuit as recited in claim 3, wherein said pulse generator is activated by a switch.

5. The low voltage DC one-shot circuit as recited in claim 4, wherein said pulse generator comprises a monostable multi-vibrator powered by a voltage from said first capacitor.

6. The low voltage DC one-shot circuit as recited in claim 5, wherein said biasing means comprises a second capacitor interconnected between said first capacitor and said pulse generator.

7. The low voltage DC one-shot circuit as recited in claim 6, wherein said second capacitor charges from said first capacitor to a common level, an output pulse from said pulse generator being coupled across said second capacitor.

8. The low voltage DC one-shot circuit as recited in claim 7, wherein said biasing means further comprises a voltage divider interposed between said second capacitor and said power gate control device.

9. The low voltage DC one-shot circuit as recited in claim 8, wherein said power gate control device comprises a field effect transistor.

10. A DC one-shot power supply, comprising:
    a battery power source;
    a charge pump connected to said battery power source and presenting an output of fixed frequency and amplitude;
    a first capacitor interconnected between said battery power source and said charge pump and generating a supply voltage;
    a pulse generator connected to and powered by said supply voltage;
    switch means connected to said pulse generator for activating said pulse generator to emit an output pulse of fixed amplitude and time duration;
    a power gate control device; and
    biasing means interposed between said pulse generator and said switch means for adding a fixed voltage value to said output pulse and applying said output pulse to said power gate control device.

11. The DC one-shot power supply according to claim 10, wherein said charge pump comprises an oscillator operating at a fixed frequency and duty cycle.

12. The DC one-shot power supply according to claim 10, further comprising a switch interconnected between said supply voltage and said pulse generator, said switch actuating said pulse generator.

13. The DC one-shot power supply according to claim 12, wherein said biasing means comprises a second capacitor interconnected between said supply voltage and said pulse generator.

14. The DC one-shot power supply according to claim 13, wherein said biasing means further comprises a voltage divider interposed between said second capacitor and said power gate control device.

15. The DC one-shot power supply according to claim 14, wherein said supply voltage is connected to an input of said pulse generator, said switch, when activated, pulling said input to ground.

* * * * *

REEXAMINATION CERTIFICATE (1850th)
United States Patent [19]
Houser, Jr. et al.

[11] B1 5,051,613
[45] Certificate Issued Nov. 17, 1992

[54] LOW VOLTAGE DC ONE-SHOT CIRCUIT

[75] Inventors: John M. Houser, Jr., Stow; Oliver G. Loughner, Cleveland, both of Ohio

[73] Assignee: Lucerne Products, Inc.

Reexamination Request:
No. 90/002,597, Feb. 18, 1992

Reexamination Certificate for:
Patent No.: 5,051,613
Issued: Sep. 24, 1991
Appl. No.: 533,100
Filed: Jun. 4, 1990

[51] Int. Cl.⁵ ............... H03K 3/02; H03K 3/033; H03K 3/355; H03K 17/687
[52] U.S. Cl. ............... 307/296.3; 307/273; 307/304; 307/584; 307/593

[58] Field of Search ............... 307/110, 296.3, 264, 307/268, 482, 578; 323/351; 361/153, 170, 187, 203; 363/60

[56] References Cited
U.S. PATENT DOCUMENTS

| | | | |
|---|---|---|---|
| 3,345,546 | 10/1967 | Beltramo | 318/132 |
| 3,391,306 | 7/1968 | Piccione | 317/148.5 |
| 4,123,671 | 10/1978 | Aihara et al. | 307/264 |
| 4,729,056 | 3/1988 | Edwards | 361/153 |
| 4,868,730 | 9/1989 | Ward | 363/21 |
| 5,047,675 | 9/1991 | Cerato et al. | 307/578 |

*Primary Examiner*—J. Zazworsky

[57] ABSTRACT

A low voltage DC one-shot circuit momentarily increases the voltage applied by a NiCad battery pack to the gate of a MOSFET. A charge pump generates a supply voltage to a monostable multivibrator which is manually actuated by a switch to emit an output pulse of fixed amplitude and pulse width. The pulse is passed through a level shift network where it is summed with a bias voltage for application to the gate of the MOSFET.

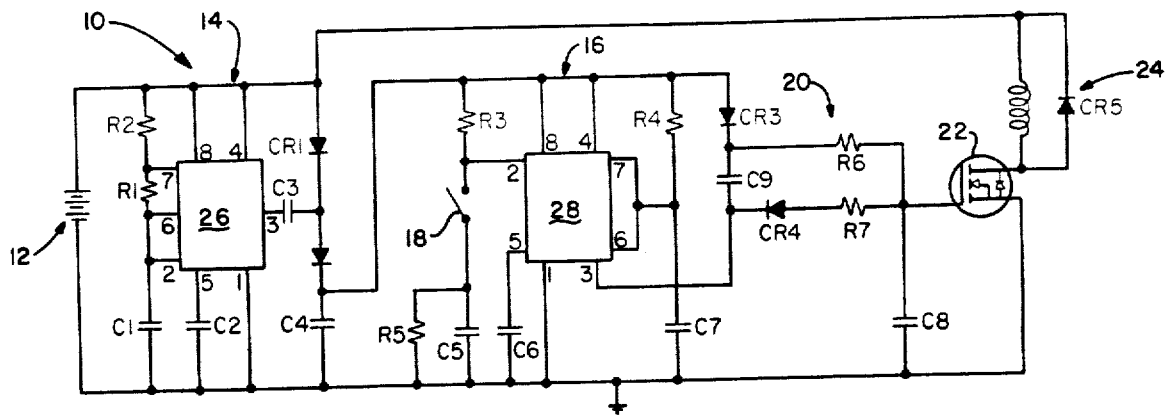

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4-15 is confirmed.

Claims 1-3 are cancelled.

* * * * *